(12) United States Patent
Mössinger (10) Patent No.: US 11,899,058 B2
(45) Date of Patent: Feb. 13, 2024

(54) AUTOMATED TEST EQUIPMENT FOR TESTING ONE OR MORE DEVICES-UNDER-TEST AND METHOD FOR OPERATING AN AUTOMATED TEST EQUIPMENT

(71) Applicant: Advantest Corporation, Tokyo (JP)

(72) Inventor: Marc Mössinger, Renningen (DE)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 17/986,780

(22) Filed: Nov. 14, 2022

(65) Prior Publication Data

US 2023/0087389 A1    Mar. 23, 2023

Related U.S. Application Data

(60) Division of application No. 17/086,079, filed on Oct. 30, 2020, now Pat. No. 11,500,013, which is a continuation of application No. PCT/EP2020/053055, filed on Feb. 6, 2020.

(60) Provisional application No. 62/949,918, filed on Dec. 18, 2019.

(51) Int. Cl.
| | |
|---|---|
| G01R 1/02 | (2006.01) |
| G01R 1/04 | (2006.01) |
| G01R 1/067 | (2006.01) |
| G01R 1/073 | (2006.01) |
| G01R 31/26 | (2020.01) |
| G01R 31/28 | (2006.01) |

(52) U.S. Cl.
CPC ..... *G01R 31/2889* (2013.01); *G01R 1/06722* (2013.01); *G01R 31/2834* (2013.01)

(58) Field of Classification Search
CPC . G01R 1/02; G01R 1/04; G01R 1/067; G01R 1/06722; G01R 1/073; G01R 31/00; G01R 31/02; G01R 31/26; G01R 31/28; G01R 31/2889; G01R 31/2834
See application file for complete search history.

(56) References Cited

U.S. PATENT DOCUMENTS

| | | | |
|---|---|---|---|
| 3,963,985 A | | 6/1976 | Geldermans |
| 4,471,298 A | * | 9/1984 | Frohlich ............ G01R 1/06705 324/763.01 |
| 5,525,912 A | | 6/1996 | Momohara |
| 7,230,437 B2 | | 6/2007 | Eldridge et al. |
| 8,169,227 B2 | | 5/2012 | Lou |

(Continued)

FOREIGN PATENT DOCUMENTS

| | | |
|---|---|---|
| EP | 0876619 A1 | 11/1998 |
| TW | 201100810 A | 1/2011 |

(Continued)

*Primary Examiner* — Neel D Shah (57) ABSTRACT

An automated test equipment for testing one or more DUTs comprises a test head and a DUT interface. The DUT interface comprises a plurality of blocks of spring-loaded pins, for example groups or fields of spring-loaded pins. For example, the DUT interface is configured for establishing an electronic signal path between the test head and a DUT board or load board, which holds the DUT or which provides a connection to the DUT. The automated test equipment is configured to allow for a variation of a distance between at least two blocks of spring-loaded pins.

19 Claims, 10 Drawing Sheets

(56) References Cited

U.S. PATENT DOCUMENTS

2006/0071679 A1* 4/2006 Gibbs ................ G01R 31/2891
324/754.03

FOREIGN PATENT DOCUMENTS

TW         201432268 A    8/2014
WO     2009002067 A1   12/2008

* cited by examiner

AUTOMATED TEST EQUIPMENT FOR TESTING ONE OR MORE DEVICES-UNDER-TEST AND METHOD FOR OPERATING AN AUTOMATED TEST EQUIPMENT

RELATED APPLICATIONS

The present Application is a Divisional Application of, and claims priority to U.S. patent application Ser. No. 17/086,079, filed Oct. 30, 2020, entitled "Automated Test Equipment for Testing One or More Devices-Under-Test and Method for Operating an Automated Test Equipment" to Mössinger, which in turn was a Continuation of PCT Application Number PCT/EP2020/053055, filed Feb. 6, 2020, which claimed priority to United States Provisional Application 62/949,918, filed Dec. 18, 2019. The present Application claims priority to U.S. Provisional Application 62/949,918, filed Dec. 18, 2019. All such applications are incorporated herein by reference in their entireties.

FIELD OF INVENTION

Embodiment of the present disclosure relate to an automated test equipment for testing one or more test devices-under-test (DUTs). Further embodiments relate to a method for operating an automated test equipment for testing one or more devices-under-test. In particular, embodiments of the present disclosure relate to a flexible DUT interface or an adaptable DUT interface.

BACKGROUND

Semiconductor test systems are used for device testing, for example, of semiconductor devices or other electronic devices. For example, one or more devices to be tested may be arranged on a wafer. For testing, a device-under-test (DUT) needs to be connected to test equipment, such as electronic instruments. For fast and efficient testing of multiple DUTs, the DUT is usually placed on a DUT board providing connectors to the DUT, the connectors being arranged to match a specific arrangement of connectors of the DUT. In turn, the DUT board may be connected to a test head via a DUT interface. The test head usually provides a connection to the test equipment. Thus, the DUT board, the DUT interface and the test head provide a connection between the DUT and the test equipment. As mentioned above, contacts of the DUT board for contacting individual contact pads of the DUT may be arranged to match a specific DUT. In contrast, opposite contacts of the DUT board for connecting the contacts contacting the DUT to the DUT interface are usually arranged according to a fixed layout, so that multiple DUT boards for various DUTs may be used with the same DUT interface. In other words, the DUT interface of a semiconductor test system usually has a certain fixed size, the connections between the test system and the DUT board (or load board) being located at specific locations.

Various solutions exist for connecting a test head to a DUT board. Document SG193487 A1 shows a docking device for connecting a semiconductor probe to a semiconductor handler, the docking device having a probe site and a handler site connecting device and a shifting device, which allows a translational and guided shifting of the probe side connecting device relative to the handler side connecting device towards and away from each other.

Document CN101002363A shows a wafer test assembly including multiple probe head substrates arranged like tiles with connectors attached to one side and probes supported on the opposing side.

Document U.S. Pat. No. 6,377,062 B1 proposes a floating interface assembly providing a signal path between an integrated circuit test head and contact pads on a load board or probe card accessing an integrated circuit to be tested. Spring-loaded pins or other contactors for contacting the contact pads are mounted on the interface assembly and linked to the test head by flexible conductors.

Document JP 2017096949A shows a probe system incorporating a configurable universal probe bar having a plurality of probe blocks comprising a plurality of probe pins positioned to be simultaneously engaged electrically with a plurality of cell contact pads of a plurality of panels of a device-under-test to deliver a plurality of electrical test signals, and an alignment system configured to align the plurality of probe pins with the plurality of self-contact pads of the plurality of panels of the device-under-test.

Further, Document WO0073905A2 shows a massively parallel interface for electronic circuitry. Document U.S. Pat. No. 9,921,266B1 shows a general universal device interface for automatic test equipment for semiconductor testing. Document WO2008070466A2 proposes sharing resources in a system for testing semiconductor devices. Document KR200427961Y1 shows a manipulator in a device for probing a panel. Document JP2013137286A shows an electronic component testing device.

Nevertheless, there is still a need for a concept for testing a DUT, the concept providing an improved tradeoff between time- and cost-efficiency in the testing of different DUTs.

SUMMARY OF THE INVENTION

An embodiment according to the invention provides an automated test equipment for testing one or more DUTs, comprising a test head and a DUT interface. The DUT interface comprises a plurality of blocks of spring-loaded pins, for example groups or fields of spring-loaded pins. For example, the DUT interface is configured for establishing an electronic signal path between the test head and a DUT board or load board, which holds the DUT or which provides a connection to the DUT. The automated test equipment is configured to allow for a variation of a distance between at least two blocks of spring-loaded pins.

For example, the test head is configured for transmitting or receiving an electronic signal to or from a spring-loaded pin of the DUT interface or for establishing an electric signal path between a spring-loaded pin of the DUT interface and a test instrument, such as a source of an electric signal or a measurement device for an electric signal. For example, a spring-loaded pin of the DUT interface may be configured for contacting a contact pad or a connector of a DUT board.

The automated test equipment relies on the idea that a DUT interface with a plurality of blocks of spring-loaded pins having a variable distance provides for a high flexibility in arranging the blocks of spring-loaded pins, thus enhancing a flexibility of a layout or design of a DUT board to be contacted by the DUT interface. Spring-loaded pins provide a means for contacting a DUT board or another circuit board particularly fast, while an electric contact between a spring-loaded pin and a contact pad or a connector may still be very good. For example, a position of the spring-loaded pin relative to a center of a contact pad that is to be contacted by the spring-loaded pin may have a comparably large tolerance, for example compared to a plug/socket connection, without comprising the connection. For example, a DUT board may have a DUT board plane on which contacts to be contacted by a DUT interface are arranged. The usage of spring-loaded pins may provide a large allowable tolerance of both a lateral alignment and a vertical or perpendicular position of the spring-loaded pins or the blocks of spring-loaded pins with respect to the DUT board plane. For example, a lateral tolerance may be defined by a lateral size of contact pads of the DUT board and a vertical tolerance by a compressibility of the spring-loaded pins.

By varying a distance between two blocks of spring-loaded pins of the DUT interface, a position of the two blocks of spring-loaded pins, that is, a layout of the DUT interface may be adapted to a layout or a position of contact pads or connectors of a DUT board. Thus, various different DUT boards, for example DUT boards having different sizes or contact pad spacing may be used with the automated test equipment. Therefore, the automated test equipment reduces restrictions in the design of DUT boards, thus allowing for a flexible design of DUT boards without causing excessive or even prohibitive effort for an adaptation or exchange of the automated test equipment. Having the connections between the test system and the DUT board far away from each other leads to increased space for multiple DUTs (multi-site setup) and a high amount of space for supporting electronic components (e.g. relays, bypassing capacitors, etc.). On the other hand, putting the connectors closer together makes the DUT Board smaller, less expensive and shorter traces to the DUT are required, thus leading to an enhanced signal performance.

Having an automated test equipment that allows for a variation of the distance between at least two blocks of spring-loaded pins facilitates to adapt the layout of the DUT interface according to a layout of a DUT board and consequently provides for a fast adaption of the automated test equipment to various DUT boards without exchanging the test head or the DUT interface. Thus, expanses for different test heads or DUT interfaces may be saved and a time efficient operation of the automated test equipment may be granted. As spring-loaded pins may provide for a tolerance of a positioning of a spring-loaded pin with respect to a contact pad the usage of spring-loaded pins is very beneficial in combination with a variation of a position of a block of spring-loaded pins. For example, a requirement to a precision of a movement of a block of spring-loaded pins may be lowered by the usage of spring-loaded pins, for example, compared to a usage of plug/socket connections.

According to an aspect of the invention, the connector fields or blocks of spring-loaded pins can be moved out or pushed together to support different requirements, for example, a lower cost, smaller DUT board with lower component space, or a larger DUT board with more component space.

According to an embodiment, the automated test equipment comprises two groups of blocks of spring-loaded pins, and the automated test equipment is configured to allow for a variation of a distance between a first group of blocks of spring-loaded pins and a second group of blocks of spring-loaded pins. Having two groups of blocks of spring-loaded pins, a distance between which may be varied, allows for a flexible design of a group of blocks of spring-loaded pins that may be moved collectively. A collective movement of the blocks of spring-loaded pins within a group, assures a fast and precise movement of the blocks of spring-loaded pins.

According to an embodiment, the first group of spring-loaded pins is a first row of blocks of spring-loaded pins and the second group of blocks of spring-loaded pins is a second row of blocks of spring-loaded pins. The first row of blocks of spring-loaded pins is parallel to the second row of blocks of spring-loaded pins, for example, parallel within a tolerance of ±1 degree or ±2 degree or ±5 degree. Further, the automated test equipment is configured to allow for a variation of a distance between the first row of blocks of spring-loaded pins and the second row of blocks of spring-loaded pins.

For example, the distance between the first and the second row of blocks of spring-loaded pins may be measured perpendicular to a direction parallel to the rows of spring-loaded pins. Varying a distance between two rows of blocks of spring-loaded pins results in a particularly small overlap of a first region covered by the first and the second rows of spring-loaded pins before a variation of the distance and a second region covered by the first and the second row of spring-loaded pins after the variation of the distance. In other words, the variation of the distance may be particularly efficient.

According to an embodiment, the DUT interface comprises at least one group of blocks of spring-loaded pins, the at least one group of blocks of spring-loaded pins comprising at least one field of blocks of spring-loaded pins.

According to an embodiment, the blocks of spring-loaded pins are coupled to the test head via flexible cables, for example, pogo cables. For example, the spring-loaded pins may be connected to the test head individually by individual flexible cables. Due to the flexible coupling between the spring-loaded pins and the test head, the blocks of spring-loaded pins may be easily moved without a need for reconnecting the spring-loaded pins to the test head after varying the distance between the blocks of spring-loaded pins.

According to an embodiment, at least one block of spring-loaded pins is guided using a linear rail, to allow for a linear shift, for example, a guided linear shift, of the block of spring-loaded pins, that is the respective or the at least one block of spring-loaded pins. A linear rail is an easy construction allowing for a precise movement of a block of spring-loaded pins.

According to an embodiment, a first block of spring-loaded pins is guided using a first linear rail, and a second block of spring-loaded pins is guided using a second linear rail, such that a distance between the first block of spring-loaded pins and the second block of spring-loaded pins can be varied by shifting the first block of spring-loaded pins and the second block of spring-loaded pins in opposite directions along the respective linear rails. For example, the first block of spring-loaded pins and the second block of spring-loaded pins may be shifted in opposite directions by equal distances.

Moving a first block of spring-loaded pins and a second block of spring-loaded pins in opposite directions may ensure that a geometrical center of an entity of the first and the second block of spring-loaded pins may remain close to or at the same position when the first and the second blocks of spring-loaded pins are shifted. Thus, an alignment of the DUT interface with a DUT board may be simplified after having changed the distance between the first and the second blocks of spring-loaded pins and the DUT board.

According to an embodiment, at least one block of spring-loaded pins is guided using a hinge. A hinge may convert a rotation into a translation. A rotation may be implemented mechanically easy and cost efficient and may be performed particularly quick and precise. According to an embodiment, at least one block of spring-loaded pins is guided using a parallelogram linkage. A parallelogram linkage may provide the advantage of using a hinge, and may further ensure a parallel alignment of a plane, on which tips of the spring-loaded pins are arranged, relative to a DUT board plane.

According to an embodiment, a basis portion of the parallelogram linkage is mechanically connected, for example attached, to the test head and a moveable carrier portion of the parallelogram linkage, which carries at least one block of spring-loaded pins, is guided to be parallel to the basis portion, for example within a tolerance of no more than +/−1 degree or no more than +/−2 degree or no more than +/−5 degree. For example, the movable carrier portion may be guided using at least two parallel links between the movable carrier portion and the basis portion.

According to an embodiment, the moveable carrier portion of the parallelogram linkage is moveable to take two different positions in which distances between the basis portion of the parallelogram linkage and the moveable carrier portion of the parallelogram which are equal.

As the parallelogram linkage is moveable to take two different positions, these two different positions may be defined by a mechanical stop, and thus, may be particularly precise. Further, a vertical position of the at least one block of spring-loaded pins referring to a direction perpendicular to a DUT board plane may be equal for both of the two different positions of the parallelogram linkage. Thus, the arrangement may allow for a precise and fast change of a position of the at least one block of spring-loaded pins, for example manually. Thus, this configuration may provide a particularly cheap and precise implementation of the automated test equipment.

According to an embodiment, the automated test equipment comprises at least a first parallelogram linkage and a second parallelogram linkage. The first parallelogram linkage carries a first block of spring-loaded pins and the second parallelogram linkage carries a second block of spring-loaded pins. The parallelogram linkages are adapted, for example arranged and/or aligned, to allow for a movement of different blocks of spring-loaded pins in opposite directions when seen in a top view which is perpendicular to a DUT board plane, for example such that projections of motion vectors of two different blocks of spring-loaded pins onto a DUT board plane have opposite directions. This embodiment combines the advantages of the parallelogram linkage and a shifting of two blocks of spring-loaded pins in opposite directions along linear rails.

According to an embodiment, the automated test equipment comprises one or more actuators, for example electric motors or pneumatic cylinders, adapted to effect the variation of the distance between at least two blocks of spring-loaded pins. The actuators may allow for a particularly precise variation of the distance between the at least two blocks of spring-loaded pins and may further allow for an automated variation of the distance. Thus, the automated test equipment may be implemented in an automated test system.

Another embodiment according to the invention provides a method for operating an automated test equipment for testing one or more devices-under-test, the automated test equipment comprising a test head and a DUT interface, wherein the DUT interface comprises a plurality of blocks of spring-loaded pins, the method comprising varying of a distance between at least two blocks of spring-loaded pins of the DUT interface.

It should be noted that the methods are based on the same considerations as the corresponding automated test device. Moreover, the methods can be supplemented by any of the features, functionalities and details which are described herein with respect to the automated test device, both individually or taken in combination.

BRIEF DESCRIPTION OF THE DRAWINGS

The accompanying drawings, which are incorporated in and form a part of this specification, illustrate embodiments of the invention and, together with the description, serve to explain the principles of the invention. Unless otherwise noted, the drawings may not be drawn to scale.

DETAILED DESCRIPTION

In the following description, embodiments are discussed in detail, however, it should be appreciated that the embodiments provide many applicable concepts that can be embodied in a wide variety of applications referring to device testing and DUT interfaces. The specific embodiments discussed are merely illustrative of specific ways to implement and use the present concept, and do not limit the scope of the embodiments. In the following description of embodiments, the same or similar elements or elements that have the same functionality are provided with the same reference sign or are identified with the same name, and a repeated description of elements provided with the same reference number or being identified with the same name is typically omitted. Hence, descriptions provided for elements having the same or similar reference numbers or being identified with the same names are mutually exchangeable or may be applied to one another in the different embodiments. In the following description, a plurality of details is set forth to provide a more thorough explanation of embodiments of the disclosure. However, it will be apparent to one skilled it the art that other embodiments may be practiced without these specific details. In other instances, well-known structures and devices are shown in block diagram form rather than in detail in order to avoid obscuring examples described herein. In addition, features of the different embodiments described herein may be combined with each other, unless specifically noted otherwise.

Figure 1:
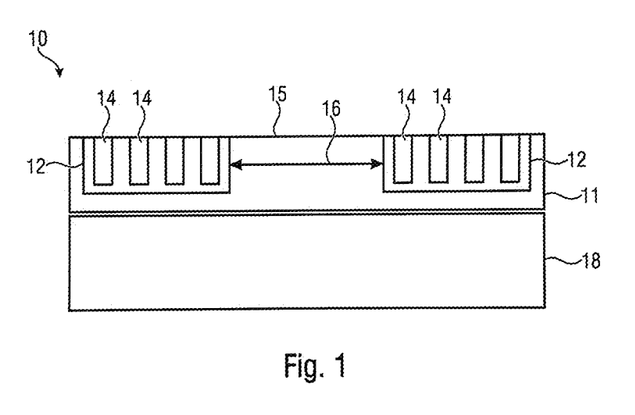
FIG. 1 illustrates an exemplary automated test equipment, in accordance with embodiments of the present invention.

FIG. 1 shows a schematic representation of an automated test equipment 10 for testing one or more DUTs according to an embodiment. The automated test equipment 10 comprises a test head 18 and a DUT interface 11. The DUT interface 11 comprises a plurality of blocks 12 of spring-loaded pins 14. The automated test equipment 10 is configured to allow for a variation of a distance between at least two blocks 12 of spring-loaded pins.

For example, the DUT interface 11 comprises a plurality of spring-loaded pins 14. The spring-loaded pins 14 may comprise electrically conductive tips, the tips of the spring-loaded pins 14 being arranged on a main plane 15 of the DUT interface 11. The tip of a spring-loaded pin 14 may be movable with respect to a body of the spring-loaded pin 14 in a direction perpendicular to the main plane 15. For example, the spring-loaded pin 14 may be compressed in the direction perpendicular to the main plane. The spring-loaded pins 14 of the DUT Interface 11 are grouped in at least two blocks 12 of spring-loaded pins. The bodies of the spring-loaded pins 14 of a block 12 of spring-loaded pins may be mechanically attached to each other by an insulating material, while the tips of individual spring-loaded pins 14 of a block 12 of spring-loaded pins may be moved individually in a direction perpendicular to the main plane. If the DUT interface 11 is pushed against a DUT board, the spring-loaded pins 14 may be compressed. As each of the spring-loaded pins 14 may be compressed individually, the spring-loaded pins 14 may provide good electric contact to a contact pad on the DUT board even if a surface of the DUT board against which the DUT interface is pushed, is uneven, or if the main plane of the DUT interface and the surface of the DUT board against which the DUT interface is pushed are not perfectly parallel.

The distance 16 between at least two blocks 12 of spring-loaded pins, which may be varied, may be measured parallel to the main plane 15 of the DUT interface.

The spring-loaded pins 14 of the DUT interface 11 may be connected, for example individually, to the test head 18. The test head 18 may provide an individual connection of a plurality of the spring-loaded pins to electronic instruments.

The automated test equipment 10 may optionally be supplemented by any of the features, functionalities and details described herein with respect to the other embodiments, both individually and taken in combination.

Figure 2:
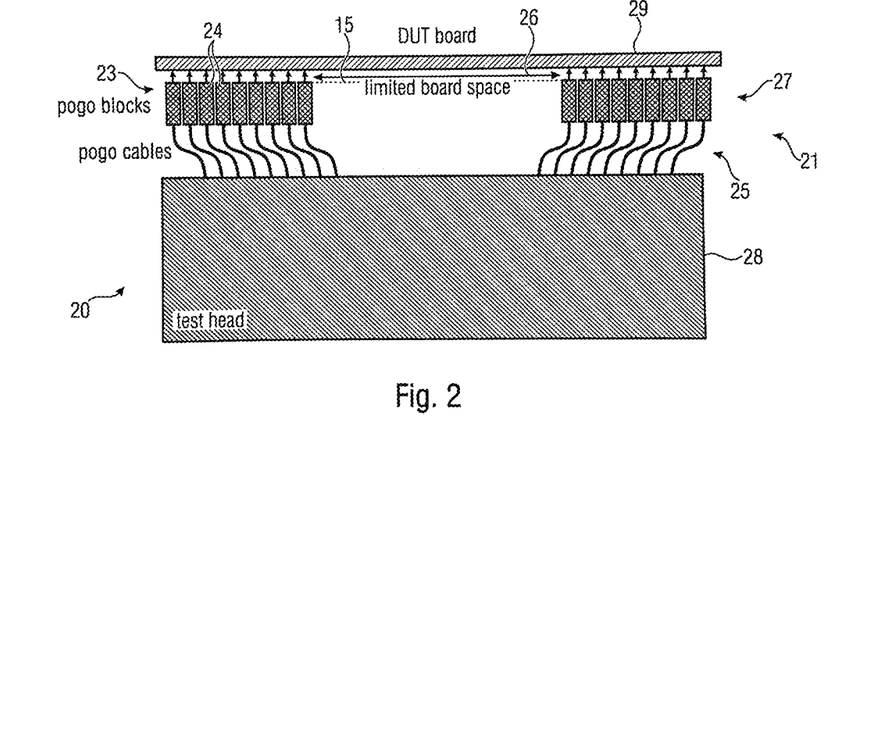
FIG. 2 illustrates an exemplary arrangement of an automated test equipment and a DUT board, in accordance with embodiments of the present invention.

FIG. 2 shows a schematic representation of an automated test equipment 20 according to an embodiment. The automated test equipment 20 may correspond to the automated test equipment 10. The automated test equipment 10 comprises a test head 28 and a DUT interface 21, which may correspond to the test head 18 and the DUT interface 11, respectively. FIG. 2 further shows an exemplary DUT board 29 to be contacted by the automated test equipment 20.

The automated test equipment 20 comprises two groups 23, 27 of blocks of spring-loaded pins, for example the blocks 12 of FIG. 1. The automated test equipment 20 is configured to allow for a variation of a distance 26 between a first group 23 of blocks of spring-loaded pins and a second group 27 of blocks of spring-loaded pins. For example, blocks of spring-loaded pins may be attached to each other to form a group 23, 27 of blocks of spring-loaded pins.

Figure 7:
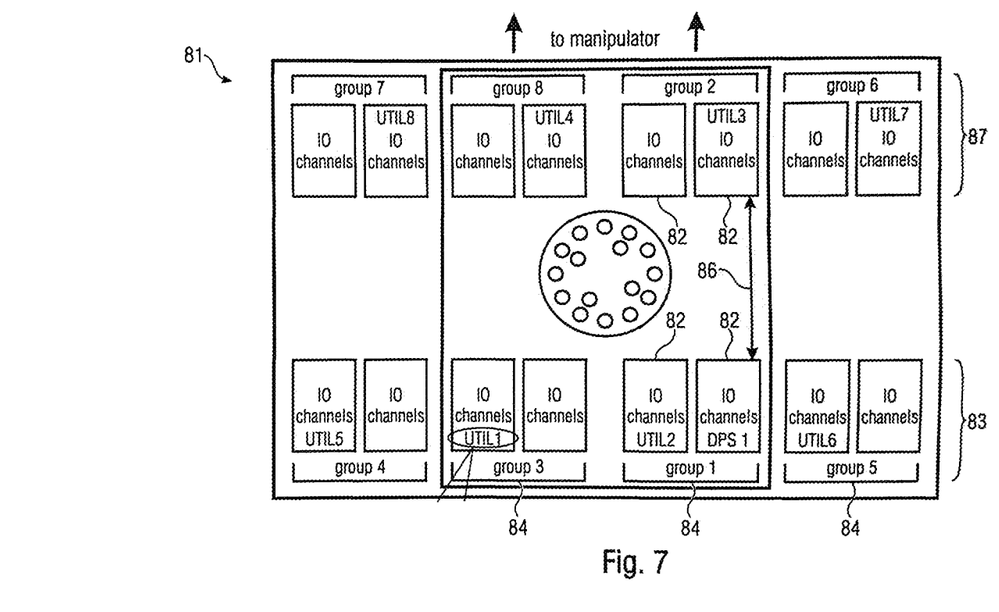
FIG. 7 illustrates an exemplary arrangement of groups of blocks of spring-loaded pins of DUT interface, in accordance with embodiments of the present invention.

FIG. 7 shows a schematic representation of a DUT interface 81 in a view along a direction perpendicular to a main plane 15 of the DUT interface 81. The DUT interface 81 may correspond to the DUT interface 11, 21. For example, FIG. 2 may show a cross-section of the DUT interface 21, 81. The DUT interface 81 comprises a plurality of blocks of spring-loaded pins, which are arranged in fields 82 of blocks of spring-loaded pins. The fields 82 of the DUT interface 81 are grouped into eight sub-groups 84. The sub-groups 84 are arranged to form a first group 83 and a second group 87 of blocks of spring-loaded pins, which may correspond to the groups 23, 27 of blocks of spring-loaded pins, respectively. A distance 86 between the groups 82, 83 of blocks of spring-loaded pins may be varied. For example, the distance 86 may correspond to the distance 26 of FIG. 2.

Accordingly, the first group 83 of blocks of spring-loaded pins may be a first row of blocks of spring-loaded pins, and the second group 87. of blocks of spring-loaded pins may be a second row of blocks of spring-loaded pins. The first row of blocks of spring-loaded pins may be parallel to the second row of blocks of spring-loaded pins. The automated test equipment may be configured to allow for a variation of a distance 86 between the first row of blocks of spring-loaded pins and the second row of blocks of spring-loaded pins.

For example, the distance 86 of the DUT interface 81 may be adapted so that the DUT interface matches a V93000 tester. For example, the DUT interface 81 may have 8 groups. For example, every group consists of 2 fields with 9 blocks of spring-loaded pins each.

According to an embodiment, the blocks of spring-loaded pins are coupled to the test head 28 via flexible cables 25. For example, the spring-loaded pins 14 of the blocks of spring-loaded pins may be coupled to the test head 18, 28 via flexible cables. This feature is independent from a grouping of blocks 12 of spring-loaded pins into groups 23, 27 of blocks 12 of spring-loaded pins.

According to an embodiment, for more flexibility, the blocks of spring-loaded pins can optionally be moved to more than one position.

Figure 3A:
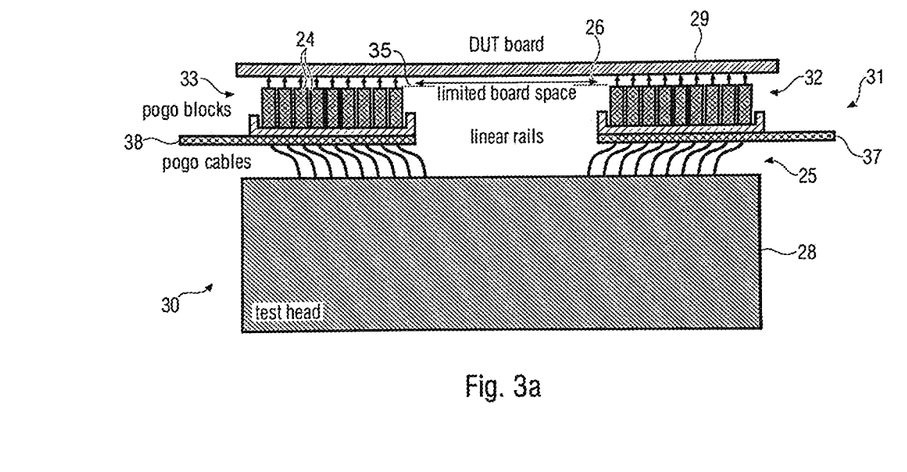
FIGS. 3A and 3B illustrate exemplary automated test equipment with linear rails, in accordance with embodiments of the present invention.
Figure 3B:
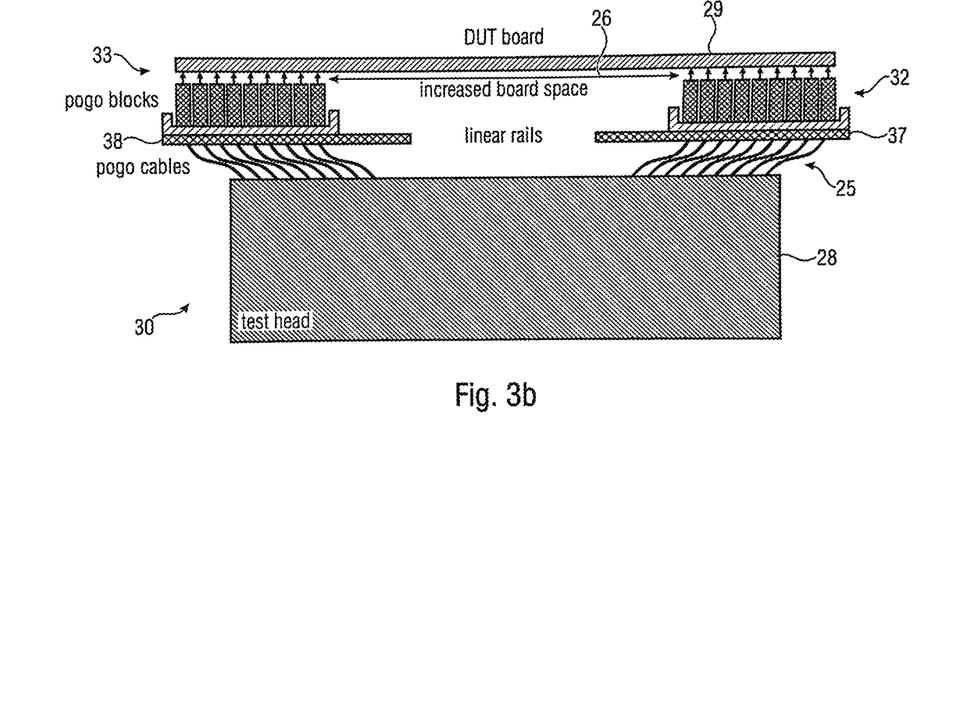

FIGS. 3A and 3B show a schematic representation of an automated test equipment 30 according to an embodiment. The automated test equipment 30 may correspond to the automated test equipment 10, 20. The automated test equipment 30 comprises the test head 28 and further comprises a first block 32 of spring-loaded pins and a second block 33 of spring-loaded pins. The blocks 32, 33 of spring-loaded pins comprise spring-loaded pins 24, which may correspond to the spring-loaded pins 14. The automated test equipment 30 comprises linear rails 37, 38. The linear rails 37, 38 provide means for shifting or moving the blocks 32, 33 of spring-loaded pins parallel to a main plane of the duty interface 31 which may be parallel to a main surface 35 of the DUT interface 31. The main surface 35 may correspond to the main surface 15 as introduced with respect to FIG. 1.

The spring-loaded pins 24 of the blocks of spring-loaded pins 32, 33 are connected to the test head 28 via flexible pogo cables 25. FIGS. 3a and 3b show two different positions of the blocks 32, 33 of spring-loaded pins. For example, FIG. 3a shows a configuration of blocks of spring-loaded pins at inner positions, and the distance 26 between the blocks 32, 33 of spring-loaded pins as shown in FIG. 3a may be used for smaller DUT boards which may have a limited board space, but which may therefore be applied in space-limited applications. For larger DUT boards providing an increased board space, the distance 26 between the blocks 32, 33 of spring-loaded pins may be increased, as shown in FIG. 3b, which may represent a configuration of blocks of spring-loaded pins at outer positions.

Accordingly, at least one block 32 of spring-loaded pins may be guided using a linear rail 37, 38, to allow for a linear shift of the block 32 of spring-loaded pins.

In other words, one implementation idea (aspect of the invention) is to increase the space by the use of linear rails.

For example, a first block 32 of spring-loaded pins is guided using a first linear rail 37, and a second block 33 of spring-loaded pins is guided using a second linear rail 38. The first block 32 of spring-loaded pins and the second block 33 of spring-loaded pins may be guided, such that a distance 26 between the first block 32 of spring-loaded pins and the second block 33 of spring-loaded pins can be varied by shifting the first block 32 of spring-loaded pins and the second block 33 of spring-loaded pins in opposite directions along the respective linear rails 37, 38.

According to an embodiment, the first block 32 of spring-loaded pins and the second block 33 of spring-loaded pins may be shifted along opposite directions by equal distances.

Figure 4:
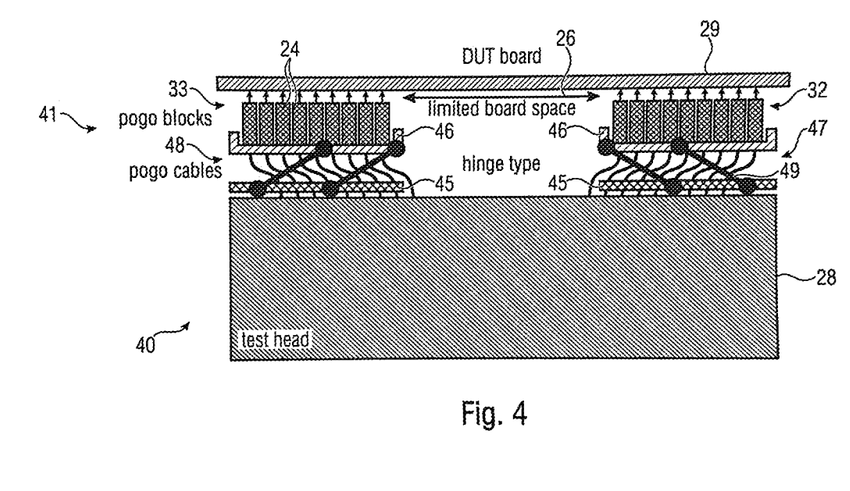
FIGS. 4 and 5 illustrate exemplary automated test equipment with a parallelogram linkage, in accordance with embodiments of the present invention.
Figure 5:
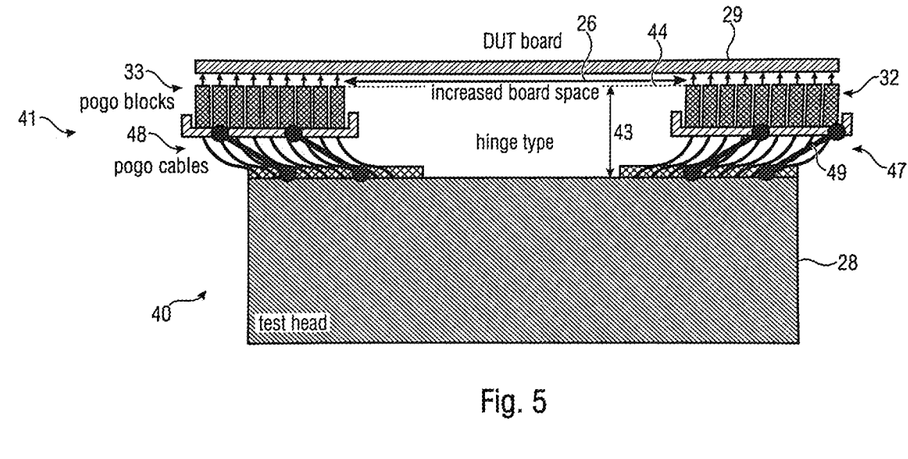

FIGS. 4 and 5 show a schematic representation of an automated test equipment 40 according to another embodiment. The automated test equipment 40 may correspond to the automated test equipment 10, 20. The automated test equipment 40 comprises the test head 28 and a DUT interface 41 which may correspond to the DUT interface 11, 21. The DUT interface 41 comprises the blocks 32, 33 of spring-loaded pins. At least one block of spring-loaded pins may be guided using a hinge. For example, at least one block of spring-loaded pins may be guided using a parallelogram linkage, for example the parallelogram linkage 47, 48 shown in FIGS. 4 and 5. In other words, another implementation idea (aspect of the invention) is to increase the space by the use of hinges.

According to an embodiment, a basis portion 45 of the parallelogram linkage 47, 48 is mechanically connected to the test head 28, and a moveable carrier portion 46 of the parallelogram linkage 47, 48, which carries at least one block 32, 33 of spring-loaded pins, is guided to be parallel to the basis portion.

For example, the moveable carrier portion 46 may be moved with respect to the basis portion 45. The parallelogram linkage 47, 48 may guide a movement of the moveable carrier portion 46 with respect to the basis portion 45 so that an angular alignment or a rotation of the moveable carrier portion 46 with respect to the basis portion 45 may remain constant during the movement, for example the movable carrier portion 46 and the basis portion 45 may be remain parallel. For example, the basis portion 45 and the moveable carrier portion 46 of the parallelogram linkage 47 may be connected by at least two parallel links 49.

FIG. 4 shows a first position of the parallelogram linkage 47, 48 in which the distance 26 between the blocks 32, 33 of spring-loaded pins has a first value, which is smaller than a second value. FIG. 5 shows a second position of the parallelogram linkages 47, 48 in which the distance 26 between the blocks 32, 33 of spring-loaded pins has the second value. A value of the distance 43 between a main plane 44 of the DUT interface 41, which may correspond to the main plane 15 of the DUT interface 11 of FIG. 1, in the second position of the parallelogram linkage 47, 48 may be equal to a value of the distance 43 in the first position of the parallelogram linkage 47, 48. In other words, FIGS. 4 and 5 may represent configurations of blocks of spring-loaded pins at inner positions and outer positions, respectively.

Accordingly, the moveable carrier portion 46 of the parallelogram linkage 47 is moveable to take two different positions in which distances 43 between the basis portion 45 of the parallelogram linkage 47 and the moveable carrier portion 46 of the parallelogram linkage 47 are equal.

According to an embodiment, the automated test equipment 40 comprises at least a first parallelogram linkage 47 and a second parallelogram linkage 48. The first parallelogram linkage 47 carries a first block 32 of spring-loaded pins and the second parallelogram linkage 48 carries a second block 33 of spring-loaded pins. The parallelogram linkages 47, 48 are adapted to allow for a movement of different blocks of spring-loaded pins, for example the blocks 32, 33 of spring-loaded pins, in opposite directions when seen in a top view which is perpendicular to a DUT board plane. For example, the DUT board plane may be parallel to the main plane 44 of the DUT interface 41, for example within a tolerance of +/−5 degrees.

Figure 6:
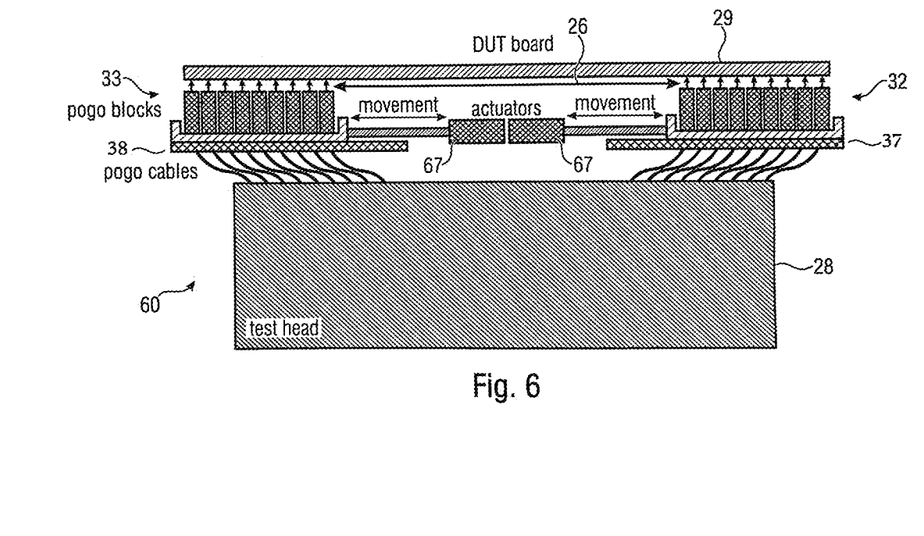
FIG. 6 illustrates an exemplary automated test equipment with an actuator, in accordance with embodiments of the present invention.

For example, FIG. 6 shows a schematic representation of an automated test equipment 60 according to an embodiment. The automated test equipment 60 may correspond to the automated test equipment 10, 20, 30. The automated test equipment 60 comprises the test head 28 and a DUT interface 61 comprising blocks 32, 33 of spring-loaded pins. The DUT interface 61 may correspond to the DUT interface 11, 21. The DUT interface 61 comprises actuators 67 for varying the distance 26 between the blocks 32, 33 of spring-loaded pins. For example, each of the blocks 32, 33 of spring-loaded pins may be moved or shifted by a separate actuator 67. According to another example, one actuator 67 is used for shifting of moving at least two blocks 32, 33 of spring-loaded pins so that a movement of the at least two blocks 32, 33 of spring-loaded pins may be opposite but at an equal rate of movement. For example, the blocks 32, 33 of spring-loaded pins may be guided by linear rails, for example the linear rails 37, 38.

Figure 8:
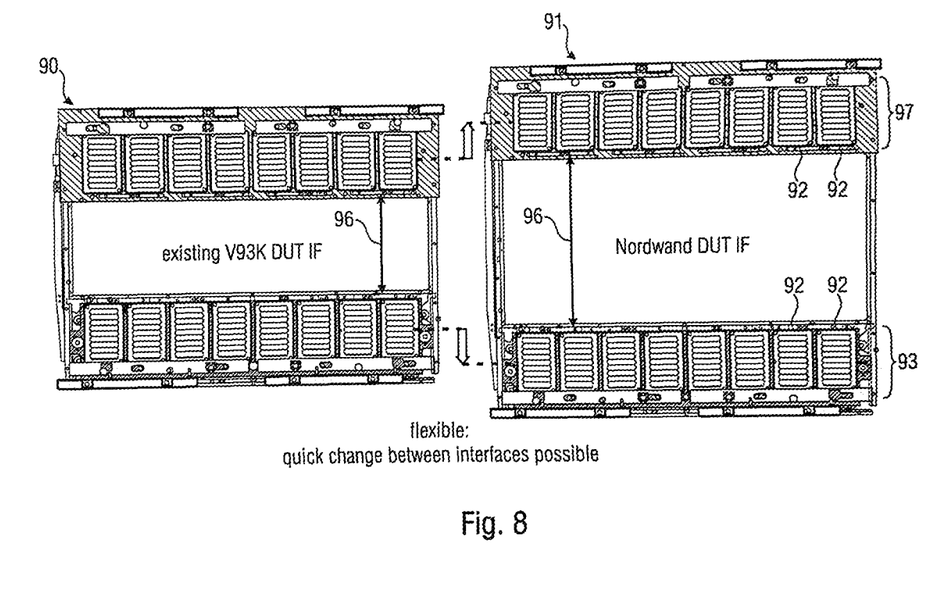
FIG. 8 shows two examples of layouts of DUT interfaces in a top view along a direction perpendicular to a main plane of the DUT interface.

FIG. 8 shows two examples of layouts of DUT interfaces 90, 91 in a top view along a direction perpendicular to a main plane of the DUT interface. The DUT interfaces 90, 91 comprise blocks 92 of spring-loaded pins grouped in a first group 93 and a second group 97 of blocks of spring-loaded pins. The two shown examples of DUT interface layouts differ by a value of a distance 96 between the first group 93 and the second group 97 of blocks of spring-loaded pins. For example, the automated test equipment 10, 20, 30, 40, 60 may allow to switch between the DUT interface layout 90 and the DUT interface layout 91 by adapting the distance 96.

Figure 9:
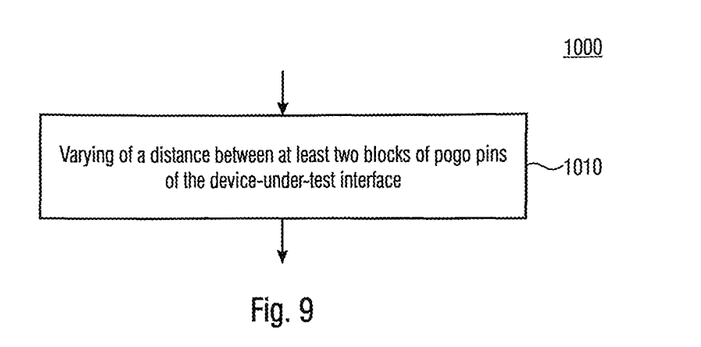
FIG. 9 shows an exemplary flow chart of a method for operating an automated test equipment, in accordance with embodiments of the present invention.

FIG. 9 shows a flowchart of a method 1000 for operating an automated test equipment 10, 20, 30, 40, 60 for testing one or more DUTs according to an embodiment, comprising a test head 18, 28 and a DUT interface 11, 21, 31, 41, 61. The method 1000 comprises varying 1010 a distance 16, 26, 86, 96 between at least two blocks 12, 32, 33, 92 of spring-loaded pins of the DUT interface 11, 21, 31, 41, 61.

Further embodiments are defined by the following aspects, which may be combined or supplemented with any details and features and functionalities disclosed herein. The aspects may be used individually or taken in combination.

An embodiment according to the invention provides a DUT interface with a size changeable means (or a means for changing a size).

According to an embodiment, the size changeable means consists of or comprises a linear rail.

According to an embodiment, the size changeable means consists of or comprises a hinge type or a hinge.

According to an embodiment, the size changeable means is used in altering the position of blocks of spring-loaded pins.

According to an embodiment, the position can be changed from an inner position to an outer position.

According to an embodiment, the position can be changed manually.

According to an embodiment, the position can be changed by an actuator.

According to an embodiment, the actuator consists of pneumatic cylinders or electric motors.

According to an embodiment, the DUT interface has a flexible cable, e.g. a pogo cable, and blocks of spring-loaded pins for signal transmission.

Although some aspects have been described as features in the context of an apparatus it is clear that such a description may also be regarded as a description of corresponding features of a method. Although some aspects have been described as features in the context of a method, it is clear that such a description may also be regarded as a description of corresponding features concerning the functionality of an apparatus.

Some or all of the method steps may be executed by (or using) a hardware apparatus, like for example, a microprocessor, a programmable computer or an electronic circuit. In some embodiments, one or more of the most important method steps may be executed by such an apparatus.

In the foregoing Detailed Description, it can be seen that various features are grouped together in examples for the purpose of streamlining the disclosure. This method of disclosure is not to be interpreted as reflecting an intention that the claimed examples require more features than are expressly recited in each claim. Rather, as the following claims reflect, subject matter may lie in less than all features of a single disclosed example. Thus the following claims are hereby incorporated into the Detailed Description, where each claim may stand on its own as a separate example. While each claim may stand on its own as a separate example, it is to be noted that, although a dependent claim may refer in the claims to a specific combination with one or more other claims, other examples may also include a combination of the dependent claim with the subject matter of each other dependent claim or a combination of each feature with other dependent or independent claims Such combinations are proposed herein unless it is stated that a specific combination is not intended. Furthermore, it is intended to include also features of a claim to any other independent claim even if this claim is not directly made dependent to the independent claim.

The above described embodiments are merely illustrative for the principles of the present disclosure. It is understood that modifications and variations of the arrangements and the details described herein will be apparent to others skilled in the art. It is the intent, therefore, to be limited only by the scope of the pending patent claims and not by the specific details presented by way of description and explanation of the embodiments herein.

What is claimed is:

1. An automated test equipment for testing one or more devices under test, the automated test equipment comprising:
   a device-under-test interface comprising a plurality of blocks of spring-loaded pins configured to electrically contact a device-under-test board;
   a hinge;
   a test head configured to couple said device-under-test interface to a test instrument,
   wherein at, least one block or spring-loaded pins of the plurality of blocks or spring-loaded pins is guided using the hinge, and
   wherein a distance between a first and a second block of the plurality of blocks of spring-loaded pins is adjustable.

2. An automated test equipment according to claim 1, wherein the plurality of blocks of spring-loaded pins comprises:
   a first group of blocks of spring-loaded pins;
   a second group of blocks of spring-loaded pins, and
   wherein a distance between the first group of blocks of spring-loaded pins and the second group of blocks of spring-loaded pins is adjustable.

3. An automated test equipment according to claim 2, wherein:
   the first group of blocks of spring-loaded pins comprises a first row of blocks of spring-loaded pins,
   wherein the second group of blocks of spring-loaded pins comprises a second row of blocks of spring-loaded pins,
   wherein the first row of blocks of spring-loaded pins is oriented parallel to the second row of blocks of spring-loaded pins, and
   wherein a distance between the first row of blocks of spring-loaded pins and the second row of blocks of spring-loaded pins is adjustable.

4. An automated test equipment according to claim 2, wherein the device-under-test interface is configured to effect variation of the distance between the first and the second blocks of spring-loaded pins.

5. An automated test equipment according to claim 1, wherein the plurality of blocks of spring-loaded pins are coupled to the test head via flexible cables.

6. An automated test equipment according to claim 1 wherein at least one block of the plurality of blocks of spring-loaded pins is guided using a parallelogram linkage.

7. An automated test equipment according to claim 6,
   wherein a basis portion of the parallelogram linkage is mechanically connected to the test head, and
   wherein a moveable carrier portion of the parallelogram linkage, which carries at least one block of the plurality of blocks of spring-loaded pins, is guided to be parallel to the basis portion.

8. An automated test equipment according to claim 7, wherein the moveable carrier portion of the parallelogram linkage is moveable between two different positions in which distances between the basis portion of the parallelogram linkage and the moveable carrier portion of the parallelogram linkage are equal.

9. An automated test equipment according to claim 1 wherein said hinge is configured to move said first group of blocks closer to said second group of blocks.

10. An automated test equipment according to claim 1 wherein said hinge is configured to move said first group of blocks farther from said second group of blocks.

11. An automated test equipment according to claim 1, further comprising a device under test board plane, and
    wherein the device-under-test interface comprises at least a first parallelogram linkage and a second parallelogram linkage,
    wherein the first parallelogram linkage carries the first block of spring-loaded pins and wherein the second parallelogram linkage carries the second block of spring-loaded pins, and
    wherein the parallelogram linkages are configured to allow for a movement of different blocks of spring-loaded pins in opposite directions perpendicular to the device-under-test board plane.

12. An apparatus comprising:
    a plurality of blocks of spring-loaded pins having an axis of travel,
    wherein the plurality of blocks of spring-loaded pins are operable to electrically couple a test head to a device under test board; and
    a mechanism to vary a distance, perpendicular to said axis of travel, between at least two blocks of said plurality of blocks of spring-loaded pins,
    wherein said mechanism comprises a hinge.

13. The apparatus of claim 12 wherein said mechanism comprises a hinge.

14. The apparatus of claim 12 wherein said mechanism comprises a parallelogram linkage.

15. The apparatus of claim 12 wherein said mechanism comprises one or more hinges configured to support said plurality of blocks of spring-loaded pins.

16. The apparatus of claim 12 wherein said at least two blocks of said plurality of blocks of spring-loaded pins are configured to be separated by at least two separation distances.

17. The apparatus of claim 12 wherein said at least two blocks of said plurality of blocks of spring-loaded pins are configured to move along at least two parallelogram linkages.

18. The apparatus of claim 12 wherein said plurality of blocks of spring-loaded pins are electrically coupled to the test head via flexible cables.

19. A method for operating an automated test equipment for testing one or more devices under test, the automated test equipment comprising a device-under-test interface, wherein the device-under-test interface comprises a plurality of blocks of spring-loaded pins, the method comprising:
   coupling one block of said plurality of blocks of spring-loaded pins to a first device under test board;
   varying, using a hinge, a distance between at least two blocks of spring-loaded pins of the device under-test interface; and
   coupling the one block of said plurality of blocks of spring-loaded pins to a second device under test board subsequent to said varying.

* * * * *